United States Patent [19]

Kattmann et al.

[11] Patent Number: 5,175,550

[45] Date of Patent: Dec. 29, 1992

[54] REPETITIVE CELL MATCHING TECHNIQUE FOR INTEGRATED CIRCUITS

[75] Inventors: Kevin M. Kattmann, Greensboro; Jeffrey G. Barrow, Oak Ridge, both of N.C.

[73] Assignee: Analog Devices, Inc., Norwood, Mass.

[21] Appl. No.: 540,098

[22] Filed: Jun. 19, 1990

[51] Int. Cl.$^5$ ............................................. H03M 1/36
[52] U.S. Cl. .................................................. 341/159
[58] Field of Search ............... 341/159, 155, 156, 157, 341/158, 160, 161; 307/360, 161, 362, 363

[56] References Cited

U.S. PATENT DOCUMENTS 4,924,227  5/1990  Mangelsdorf ........................ 341/159
4,928,103  5/1990  Lane .................................... 341/159

Primary Examiner—A. D. Pellinen
Assistant Examiner—B. K. Young
Attorney, Agent, or Firm—Parmelee, Bollinger & Bramblett

[57] ABSTRACT

An integrated-circuit A-to-D converter having repetitive cells which are designed to be matched, but which are subject to uncontrolled mismatches adversely affecting performance. In the disclosed embodiment, the cells all include resistors (of equal ohmic value) carrying currents (designed to be of equal value) producing corresponding output signals. To avoid the effects of cell mismatch on the output signals, a network of equal-valued resistors is added to the circuit, with each network resistor connected between corresponding ends of adjacent pairs of the cell resistors.

14 Claims, 3 Drawing Sheets

ERROR REDUCTION FACTOR FOR $R_2/R_1$

REPETITIVE CELL MATCHING TECHNIQUE FOR INTEGRATED CIRCUITS

BACKGROUND OF THE INVENTION

1. Field of the Invention

This invention relates to integrated circuits (ICs) having repetitive cells designed to be matched for proper circuit operation. More particularly, this invention relates to such integrated circuits having means to reduce the adverse effects of cell mismatch on circuit operation.

2. Description of the Prior Art

There are many integrated circuits which include a large number of repetitive cells designed to perform in matched fashion so as to assure specified circuit performance. Such cells often include impedance elements such as resistors which are for example supplied by current sources to produce corresponding output signals. Analog-to-digital (A/D) and digital-to-analog (D/A) converters are examples of devices which frequently incorporate such repetitive cells.

One problem which often arises with such integrated circuits is that in a practical device the actual match between cells turns out to be less than wanted, so that the device performance is less than satisfactory. For example, in A/D converters of the flash type, mismatch between repetitive cells typically forming part of the comparators conventionally used in such converters will adversely affect the differential and integral linearity of the digital output. Thus, in any group of processed monolithic chips having such integrated circuits, the number of parts meeting specifications for high-grade performance may be much smaller than desired due to random mismatches caused by small deviations from nominal in the parameters of some of the circuit elements.

Attempts have been made to solve this problem of mismatch between repetitive cells in an integrated circuit, but the results of such attempts have not been satisfactory. Accordingly, it is a principal object of this invention to solve this problem by the use of improved techniques for substantially reducing the effects of such mismatches.

SUMMARY OF THE INVENTION

In one presently preferred exemplary embodiment of the invention, to be described hereinbelow in detail, the effects of mismatch between repetitive cells for developing current flows through respective impedance elements in the form of resistors is considerably reduced by the addition of an impedance network comprising individual compensating resistors connected between corresponding ends of the cell resistors. If the cells are perfectly matched, the added network carries no current and thus has no effect on performance. If however elements of some of the repetitive cells are imperfectly manufactured so as to create some degree of mismatch (as is often the case), the elements of the additional network carry corresponding currents which reduce the adverse effects of the mismatch on the device performance. More particularly, the added impedance network forms gain-selective circuitry which reduces the effective gain of the cell in its response to error components relative to the gain of the cell for signal components. Thus, the error sees less gain than the signal so that the error is relatively suppressed.

Other objects, aspects and advantages of the invention will in part be pointed out in, and in part apparent from, the following detailed description of the presently preferred embodiment, considered together with the accompanying drawings.

DETAILED DESCRIPTION OF A PREFERRED EMBODIMENT

Figure 1:
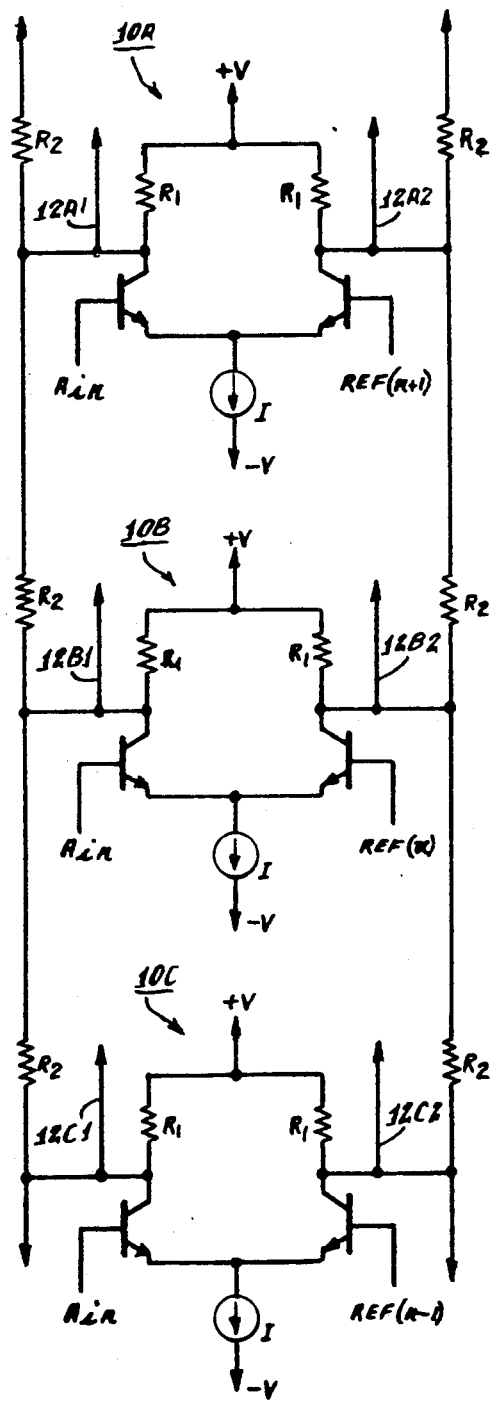
FIG. 1 is a schematic diagram showing elements of repetitive cells in an integrated circuit formed on a monolithic chip, together with an additional resistor network for reducing the effects of cell mismatch.

Referring now to FIG. 1, there is shown a series of repetitive cells 10A, 10B, 10C which are designed to be identical. Although only three cells are shown, it will be understood that typically there will be many more than three in the complete set of cells. The cells shown here are differential amplifiers, and each may for example form part of a comparator in a "flash" or parallel A/D converter. There are many different types of such comparators. One type is disclosed in U.S. Pat. No. 4,270,118 (Brokaw). Another type is sold commercially as the AD9002, by Analog Devices, Inc., assignee of this application. The AD9002 is an 8-bit converter having 256 comparators with repetitive matched cells.

Figure 2:
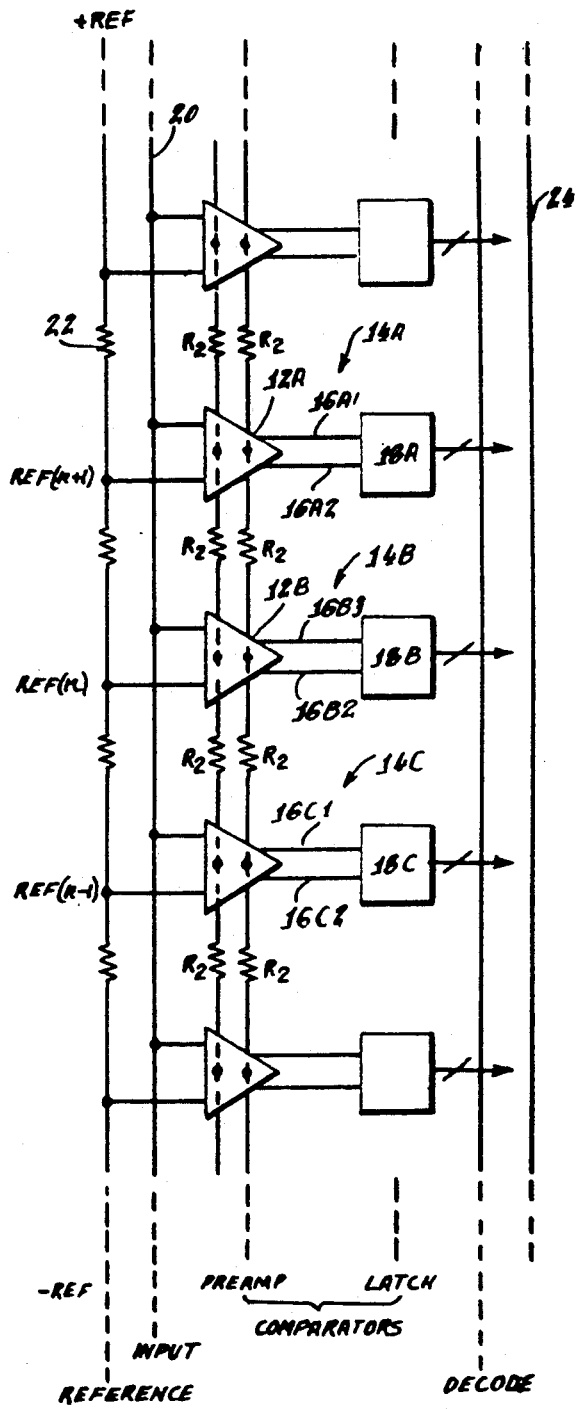
FIG. 2 is a schematic diagram illustrating the architecture of a flash-type A/D converter employing repetitive cells such as shown in FIG. 1.

Each of the cells 10A, B, C, may for example serve as the output stage of a pre-amp 12A, B, C (see FIG. 2) forming part of a comparator 14A, B, C. The differential output lines 16A1, 16A2, etc., of these pre-amps are connected to respective input terminals of corresponding latches 18A, B, C for the comparators. The pre-amps have one input connected to the common analog input line 20. The other input of each pre-amp is connected to a corresponding node of a resistor-string reference line 22 which, as is conventional, produces respective step-wise incremental reference voltages (Ref) to be compared with the analog input. The outputs of the latches 18A, etc., are directed to known logic circuitry 24 for developing the digital output of the converter.

Turning now to the repetitive cells 10A, B, C, in more detail, it will be seen that each cell includes a pair of resistors R1 which are connected together at their upper ends at a common point which in this example is returned to a positive voltage supply +V, possibly through further circuitry. The impedance (ohmic) values of the resistors R1 are in accordance with a predetermined pattern; in the particular preferred embodiment described, the resistors R1 are of equal ohmic value. The lower ends of the the pairs of cell resistors R1 are connected through respective transistors to a common current source I. Each cell will conduct current through one or the other of its pair of resistors R1, through that corresponding transistor which is turned on, and thence to the common current source I.

The base of the left-hand transistor of each pair receives an analog input signal Ain, derived from the analog input line 20, e.g. with further amplification. The base of the right-hand transistor receives a reference input voltage $Ref_n$ derived from the voltage at the corresponding node of the reference line 22.

Which transistor is turned on for any given cell depends upon whether the corresponding cell reference voltage ($Ref_n$) is more positive or less positive than the analog input Ain. Thus, for a particular analog input, all of the cells above one specific cell will conduct the current I through their right-hand resistor R1 and produce a corresponding output at 12A2, etc., and all other cells will conduct the current I through their left-hand resistors and produce corresponding outputs at 12B1, 12C1, etc. The resulting differential outputs on lines 16A1, 16A2, etc., will switch the latches 18A, etc., correspondingly, and logic 24 will produce a digital output signal representing the analog input on line 20.

As noted above, one serious problem with such repetitive cells is that, in any practical implementation of an integrated circuit, there will be mismatches between the cells. Mismatch may result from a variety of causes, such as deviations from nominal in the value of a resistor R1, or in the output of a current source. Regardless of the cause, mismatch can be treated basically as an error in the current flowing through one of the resistors R1. That is, the current through at least one of the resistors R1 can be defined as $I+\Delta I$, where $\Delta I$ is the current error.

Figure 3:
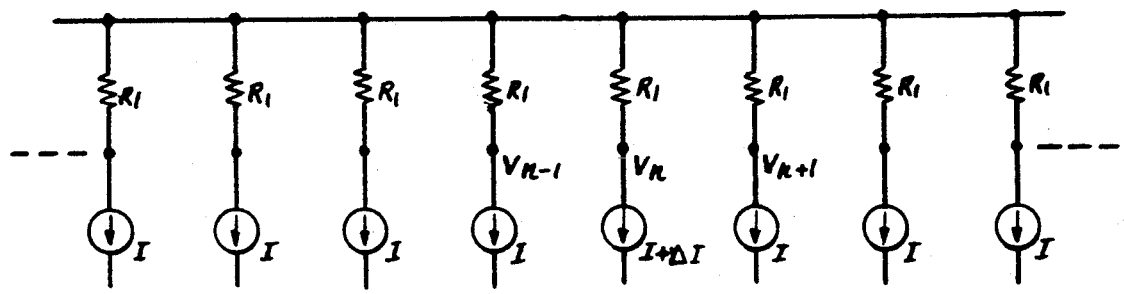
FIG. 3 is a schematic diagram of an equivalent half-circuit of the basic resistor arrangement of the repetitive cells of FIG. 1.

This is illustrated in the equivalent circuit resistor network of FIG. 3. This circuit comprises the successive resistors R1 which are carrying current, i.e. the resistors whose transistors are turned on. Thus, a set of the left-most resistors may represent left-hand cell resistors R1 of the cells 10A, etc., with the resistors to the right of that first set representing right-hand cell resistors R1. It is not necessary in the following analysis to establish the location of the break point between activated left-hand and activated right-hand resistors of the cells.

The occurrence of a current error $\Delta I$ in any of the R1 legs of the cell resistor network represents a mismatch between the cells, and can cause serious problems, particularly in a high-performance circuit such as a comparator for an A/D converter. However, it has been found that this problem can be significantly ameliorated by a relatively simple modification, shown in FIG. 1 as part of the repetitive cell circuit. More specifically, this modification is the incorporation of an additional network of resistors R2.

Each of the additional resistors R2 is connected between corresponding ends of a respective adjacent pair of the successive resistors R1. The impedance (ohmic) values of the resistors R2 are in accordance with a predetermined pattern corresponding to the pattern of impedance values of the first set of resistors R1 In the particular preferred embodiment described herein, the ohmic resistances of the resistors R2 are all equal, as are the resistances of resistors R1. Still other corresponding patterns can be utilized; for example, both sets of resistors could be binarily graded in impedance.

Figure 4:
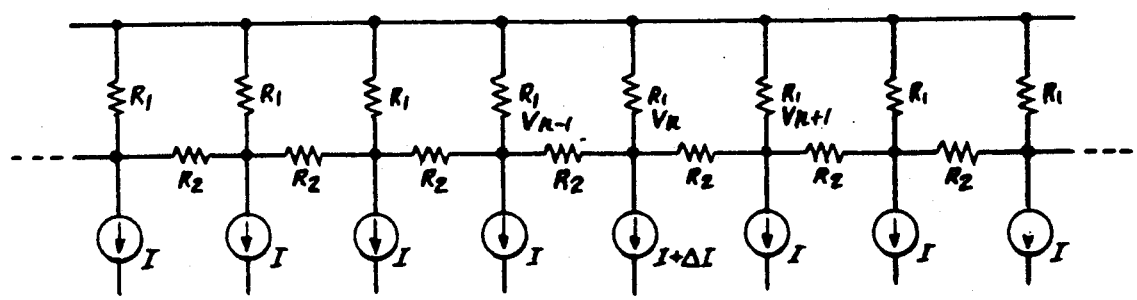
FIG. 4 is a schematic diagram of an equivalent half-circuit like that of FIG. 3, but modified by the addition of a network of compensating resistors.

The interconnection of the two networks of resistors may be understood more clearly by reference to FIG. 4 which shows an equivalent half-circuit of the composite network arrangement including both sets of resistors R1 and R2.

Referring now to FIG. 3 in more detail, the output error of any traditional repetitive cell may be defined as $V_n - V_{n-1}$, resulting from an error current of $\Delta I$ as shown for the current for one cell producing the output $V_n$ in FIG. 3. The signal gain and error gain can then be defined as:

$$A_{vs} = k \cdot (V_{n-1})/I \quad (1)$$

$$A_{ve} = k \cdot (V_n - V_{n-1})/\Delta I \quad (2)$$

(where k is a proportionality factor)

Applying these equations to the network of FIG. 3 gives:

$$A_{vs} = k \cdot R1 \quad (3)$$

$$A_{ve} = k \cdot R1 \quad (4)$$

The latter equations are identical, showing simply that the input to output gain for the signal is the same as for any errors.

Turning now to FIG. 4, which includes the additional network of compensating resistors R2, the definitions of signal gain and error gain remain the same as equations (1) and (2). When $\Delta I = 0$, then:

$$V_n = V_{n-1} = I \cdot R1 \quad (5) \text{ and}$$

$$A_{vs} = k \cdot R1 \quad (6)$$

Thus when $\Delta I = 0$, the behavior of the FIG. 4 circuit is the same as that of FIG. 3, as would be expected.

When $\Delta I$ is not zero (indicating a cell mismatch), then by virtue of the principle of superposition:

$$V_n = I \cdot R1 + \Delta I \cdot Req \quad (7)$$

where Req is the equivalent load resistance looking up from the $I + \Delta I$ current source in FIG. 4. Examination of that part of the circuit shows that:

$$Req = R1 \cdot (Rx/2)/(R1 + Rx/2) \quad (8)$$

Figure 5:
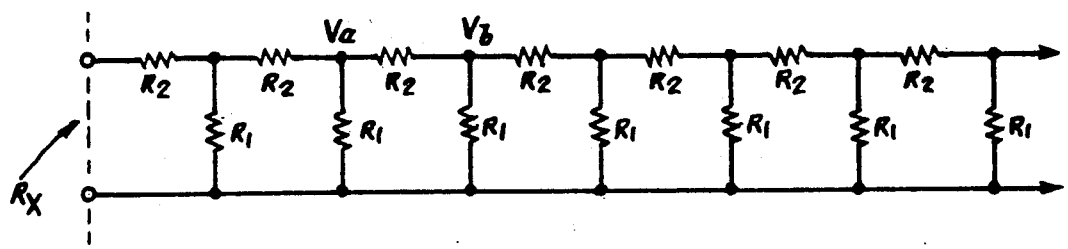
FIG. 5 is a schematic diagram illustrating aspects of the composite resistor arrangement of FIG. 4.

(where Rx is the resistance illustrated in FIG. 5)

Since typically there are a large number of repetitive cells, it is reasonable to treat the network in FIG. 5 as infinite in extent, in which case:

$$Rx = R2 + (R1 \cdot Rx/(R1 + Rx)) \quad (9) \text{ or}$$

$$Rx^2 - R2 \cdot Rx - R2 \cdot R1 = 0 \quad (10)$$

Solving for Rx:

$$Rx = (R2 + \sqrt{(R2^2 + 4R2 \cdot R1)})/2 \quad (11)$$

By using equations (8) and (11) with equation (7), a solution for $V_n$ is obtained.

Next, it is necessary to determine $V_{n-1}$. For that, it may first be noted that there is a voltage-divider relationship between $V_a$ and $V_b$ in FIG. 5. Solving for a voltage applied at $V_a$ results in:

$$V_b = V_a \cdot (R1 \cdot Rx/(R1 + Rx))/Rx \quad (12)$$

$$= V_a \cdot (R1/(R1 + Rx)) \quad (13)$$

Thus:

$$V_{n-1} = I \cdot R1 + \Delta I \, Req \cdot (R1/(R1+Rx)) \quad (14)$$

Solving for the error gain when $\Delta I$ is not zero:

$$A_{ve} = k \cdot Req \cdot (1 - R1/(R1+Rx)) \quad (15)$$

When this has been further reduced, it will be found that when R2 is less than $\infty$, the error component is subjected to less gain than the signal component, so that the error is relatively suppressed.

The effectiveness of this error suppression can be measured by calculating the ratio of $A_{ve}$ for the gain-selective circuit of FIG. 4 to $A_{ve}$ for the conventional circuit of FIG. 3, as follows:

$$\text{Error Reduction Factor} = Req \cdot (1 - R1/(R1+Rx))/R1 \quad (16)$$

Figure 6:
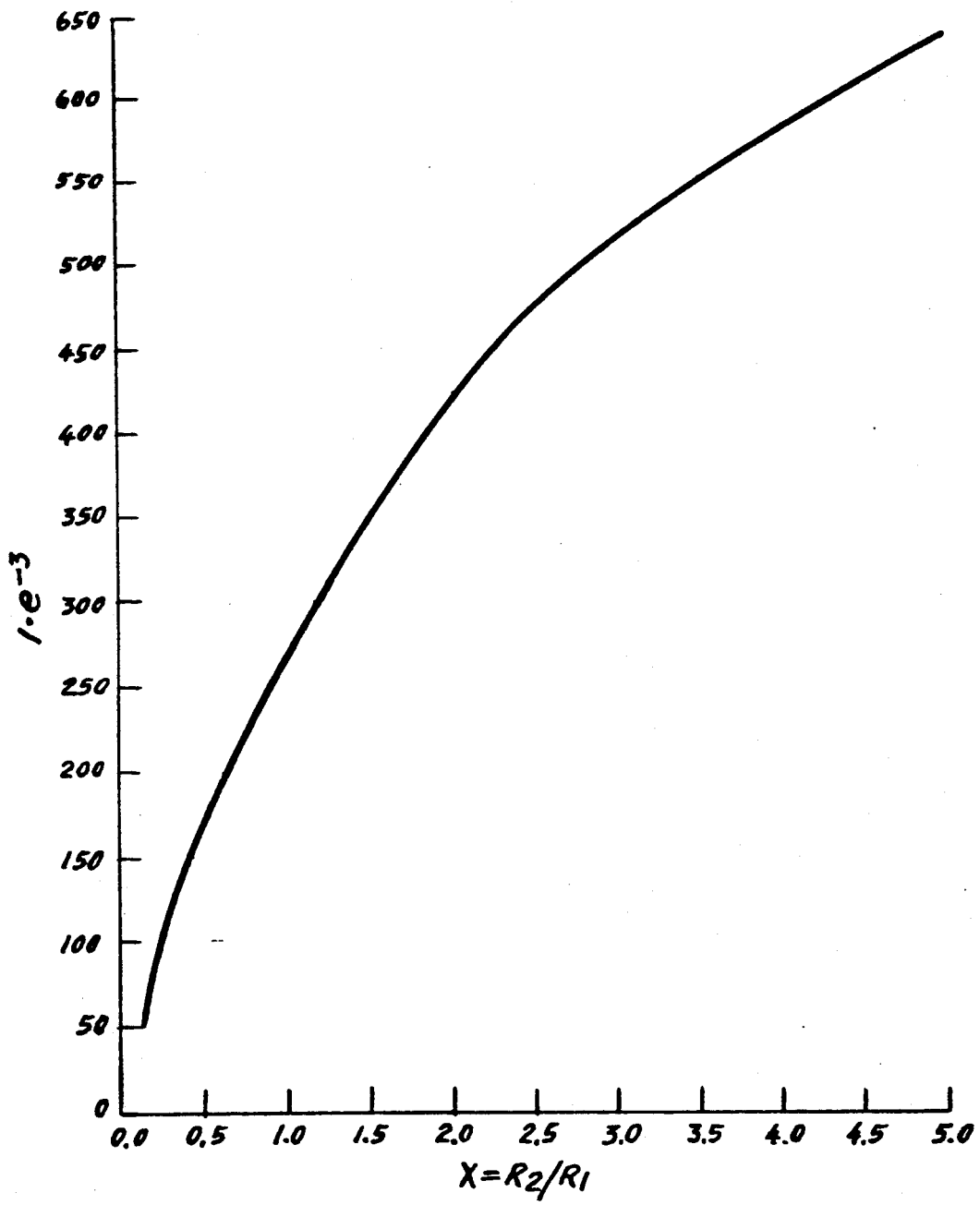
FIG. 6 is a graph showing the error reduction factor provided by the additional resistor network of FIG. 4, plotted against the ratio of compensating resistor to cell resistor.

FIG. 6 is a graph showing this factor plotted against the ratio of R2/R1. At large values of R2 (approaching infinity), this factor approaches 1.0, representing no improvement. In one practical embodiment of the invention, R2 was set at 6K and R1 at 4.7K, giving a ratio R2/R1 of nearly 1.3. From the graph of FIG. 6, it will be seen that in this embodiment the error would be suppressed by a factor of nearly 70%, giving a very substantial reduction in error.

Such error suppression greatly increases the yield of integrated-circuit parts having repetitive cells. The improvement is especially valuable for parts intended for high-grade performance.

The improvement afforded by this invention is achieved with only small increase in device count, and with no increase in power requirements. The error suppression is effective regardless of the source of the matching error, and as is evident from the graph of FIG. 6 can be substantial in magnitude.

Although a specific preferred embodiment of the invention has been described herein in detail, it is to be understood that this is for the purpose of illustrating the invention, and should not be construed as necessarily limiting the scope of the invention since it is apparent that many changes can be made by those skilled in the art while still practicing the invention claimed herein. For example, although the compensating circuitry in the specific embodiment is described as part of the preamp 12, such compensation could if desired be incorporated in other portions of the device, such as in the decoder 24. Also, although the invention is shown specifically for use with cells employing resistive circuit elements, the general principles of the invention provide for its application to other types of impedance elements such as capacitance elements, in which case compensating elements with reactive impedance may be employed. In addition, although bipolar transistors are employed in the repetitive cells of the preferred embodiment, it will be apparent that the invention is applicable to other types of cells such as those incorporating FETs, MOS switch elements, and so on. Accordingly, the scope of the invention should not be interpreted as being restricted in any way by such specific aspects of the present disclosure.

What is claimed is:

1. In a monolithic chip formed with an integrated circuit including a number of repetitive cells for producing output signals in response to respective inputs, each of said cells including a circuit element having two terminals to provide for the flow therethrough of a current from an associated current source and producing a corresponding cell output signal;

that improvement for reducing the effects of cell mismatch on said output signals comprising:

an impedance network comprising a set of impedance elements each connected between the corresponding terminals of respective pairs of said circuit elements, with each circuit element of such pairs forming part of a respective cell, said impedance elements permitting the flow of current therethrough serving to reduce the effects of cell mismatch on said output signals.

2. An integrated circuit as in claim 1, wherein said circuit elements for said cells have impedances in accordance with a predetermined pattern.

3. An integrated circuit as in claim 2, wherein said impedance elements have impedances in accordance with a predetermined pattern corresponding to said pattern of said circuit elements.

4. An integrated circuit as in claim 3, wherein said patterns of impedances provide equal-valued circuit elements and equal-valued impedance elements.

5. In a monolithic chip formed with an integrated circuit including a number of repetitive cells for producing output signals in response to respective inputs, each of said cells including a first resistor receiving a current from an associated current source and producing a corresponding cell output signal;

that improvement for reducing the effects of cell mismatch on said output signals comprising:

a resistor network comprising a set of second resistors each connected between the corresponding ends of respective pairs of said first resistors each forming part of a different cell, to permit the flow of current serving to reduce the effects of cell mismatch on said output signals.

6. An integrated circuit as in claim 5, wherein said first resistors for said cells have ohmic resistances in accordance with a predetermined pattern.

7. An integrated circuit as in claim 6 wherein said second resistors have ohmic resistances in accordance with a predetermined pattern corresponding to said pattern of said first resistors.

8. An integrated circuit as in claim 7, wherein said patterns of ohmic resistances provide equal-valued first resistors and equal-valued second resistors.

9. An integrated circuit as in claim 5, wherein each of said repetitive cells comprises a differential amplifier including a pair of transistors;

said first resistors being connected as pairs of resistors where one of each pair is in series with one of a corresponding pair of said transistors respectively to conduct current depending upon which transistor of the pair is turned on; and a current source connected to both transistors of each pair to supply the current for the turned-on transistor.

10. An integrated circuit as in claim 9, wherein each of said differential amplifiers forms part of a comparator.

11. An integrated circuit as in claim 10, wherein said comparators are interconnected to form part of a flash-type A/D converter.

12. In a monolithic chip formed with an integrated circuit including a number of repetitive cells for producing output signals in response to respective inputs, each of said cells including a circuit element having two terminals to provide for the flow therethrough of a current from an associated current source and producing a corresponding cell output signal;

the method of reducing the effects of cell mismatch on said output signals comprising:

controllably diverting current between corresponding terminals of pairs of said circuit elements wherein each circuit element of such pairs forms part of a respective cell.

13. The method of claim 12, wherein said current is diverted between said corresponding terminals by respective impedance elements.

14. The method of claim 13, wherein said diverting is effected by resistors.

* * * * *